(12) United States Patent
Matsumoto et al.

(10) Patent No.: US 9,496,203 B2
(45) Date of Patent: Nov. 15, 2016

(54) SEMICONDUCTOR DEVICE

(71) Applicant: Renesas Electronics Corporation, Kawasaki-shi, Kanagawa (JP)

(72) Inventors: Akira Matsumoto, Kanagawa (JP); Yoshinao Miura, Kanagawa (JP); Yasutaka Nakashiba, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/727,446

(22) Filed: Jun. 1, 2015

(65) Prior Publication Data

US 2015/0263002 A1    Sep. 17, 2015

Related U.S. Application Data

(63) Continuation of application No. 14/339,013, filed on Jul. 23, 2014, now Pat. No. 9,054,073.

(30) Foreign Application Priority Data

Jul. 31, 2013    (JP) .................. 2013-158833

(51) Int. Cl.
*H01L 23/482* (2006.01)
*H01L 27/088* (2006.01)
(Continued)

(52) U.S. Cl.
CPC ......... *H01L 23/4824* (2013.01); *H01L 23/492* (2013.01); *H01L 23/50* (2013.01); *H01L 23/528* (2013.01); *H01L 24/06* (2013.01); *H01L 24/49* (2013.01); *H01L 27/0203* (2013.01); *H01L 27/0605* (2013.01); *H01L 27/088* (2013.01); *H01L 29/41758* (2013.01); *H01L 29/4236* (2013.01); *H01L 29/7786* (2013.01); *H01L 29/78* (2013.01); *H01L 23/49562* (2013.01); *H01L 24/45* (2013.01); *H01L 24/48* (2013.01); *H01L 29/1066* (2013.01); *H01L 29/2003* (2013.01); *H01L 2224/04042* (2013.01); *H01L 2224/0603* (2013.01); *H01L 2224/06051* (2013.01); *H01L 2224/451* (2013.01); *H01L 2224/45014* (2013.01); *H01L 2224/4805* (2013.01); *H01L 2224/4813* (2013.01); *H01L 2224/48247* (2013.01); *H01L 2224/49113* (2013.01); *H01L 2924/0002* (2013.01);
(Continued)

(58) Field of Classification Search
CPC ... H01L 23/48; H01L 23/481; H01L 23/482; H01L 23/4824; H01L 23/485; H01L 23/528; H01L 23/5283; H01L 27/088; H01L 27/105; H01L 29/6674
See application file for complete search history.

(56) References Cited

U.S. PATENT DOCUMENTS

| 4,949,139 A | 8/1990 | Korsh et al. |
| 5,731,614 A | 3/1998 | Ham |

(Continued)

*Primary Examiner* — Eduardo A Rodela
(74) *Attorney, Agent, or Firm* — Womble Carlyle

(57) ABSTRACT

Disclosed is a semiconductor device in which a resistance component resulting from wiring is reduced. A plurality of transistor units are arranged side by side in a first direction (Y direction in the view), each of which has a plurality of transistors. The gate electrodes of the transistors extend in the first direction. First source wiring extends between first transistor unit and second transistor unit, and first drain wiring extends between the second transistor unit and third transistor unit. Second drain wiring extends on the side of the first transistor unit opposite to the side where the first source wiring extends, and second source wiring extends on the side of the third transistor unit opposite to the side where the second drain wiring extends.

7 Claims, 11 Drawing Sheets

(51) Int. Cl.
*H01L 27/02* (2006.01)
*H01L 29/417* (2006.01)
*H01L 23/50* (2006.01)
*H01L 23/492* (2006.01)
*H01L 23/528* (2006.01)
*H01L 23/00* (2006.01)
*H01L 27/06* (2006.01)
*H01L 29/423* (2006.01)
*H01L 29/78* (2006.01)
*H01L 29/778* (2006.01)
*H01L 23/495* (2006.01)
*H01L 29/10* (2006.01)
*H01L 29/20* (2006.01)

(52) U.S. Cl.
CPC ............... *H01L2924/00014* (2013.01); *H01L 2924/1033* (2013.01); *H01L 2924/30101* (2013.01)

(56) References Cited

U.S. PATENT DOCUMENTS

| | | | |
|---|---|---|---|
| 6,274,896 B1* | 8/2001 | Gibson | ............... B41J 2/14072 257/259 |
| 6,437,402 B1 | 8/2002 | Yamamoto | |
| 6,946,891 B2 | 9/2005 | Asano et al. | |
| 7,687,912 B2* | 3/2010 | Heiling | ............... H01L 23/4824 257/758 |
| 2004/0051395 A1 | 3/2004 | Brindle et al. | |
| 2007/0280054 A1 | 12/2007 | Watanabe | |
| 2009/0206420 A1* | 8/2009 | Stecher | ............... H01L 23/4824 257/390 |
| 2011/0044016 A1 | 2/2011 | Takagi | |
| 2012/0326235 A1 | 12/2012 | Otsuru et al. | |

\* cited by examiner

SEMICONDUCTOR DEVICE

CROSS-REFERENCE TO RELATED APPLICATIONS

This is a Continuation of U.S. patent application Ser. No. 14/339,013, filed Jul. 23, 2014, now U.S. Pat. No. 9,054,073, which claims priority to Japanese Patent Application No. 2013-158833 filed on Jul. 31, 2013. The contents of the aforementioned applications are incorporated herein by reference in their entirety.

BACKGROUND

The present invention relates to a semiconductor device, and in particular, to a technique applicable to a semiconductor device including, for example, a transistor and wiring.

One type of semiconductor devices has a transistor for power control. Such a semiconductor device is described, for example, in Japanese Unexamined Patent Publication No. 2001-77206. The above Unexamined Patent describes that a plurality of transistor cells are arranged in parallel to each other. In detail, a plurality of transistors is provided in parallel to each other in each transistor cell. Drain wiring and source wiring are pulled out from each transistor so as to be oriented in directions opposite to each other. Members to be coupled to the drain wiring and those to be coupled to the source wiring are both arranged between the transistors cells.

On the other hand, transistors each using a compound semiconductor layer as a channel are recently under development. This transistor has a characteristic that an on-resistance is low.

SUMMARY

There is a need for reducing an on-resistance in a semiconductor device having a transistor. This on-resistance includes a component resulting from the transistor and that resulting from wiring. The present inventors have investigated how the resistance component resulting from wiring can be reduced. Other problems and new characteristics will become clear from the description and accompanying drawings of the present specification.

According to an embodiment, a semiconductor device includes a first transistor unit, a second transistor unit, and a third transistor unit. These transistor units are arranged side by side in this order in a first direction, each of which has a plurality of transistors whose gate electrodes extend in the first direction. First wiring extends between the first transistor unit and the second transistor unit, and second wiring extends on the side of the first transistor unit opposite to the side where the first wiring extends; while third wiring extends between the second transistor unit and the third transistor unit, and fourth wiring extends on the side of the third transistor unit opposite to the side where the third wiring extends. The first wiring is coupled to both the source electrodes of the transistors in the first transistor unit and to those of the transistors in the second transistor unit. The second wiring is coupled to the drain electrodes of the transistors in the first transistor unit. The third wiring is coupled to both the drain electrodes of the transistors in the second transistor unit and to those of the transistors in the third transistor unit. The fourth wiring extends in a second direction and is coupled to the source electrodes of the transistors in the third transistor unit.

According to the embodiment, a resistance component resulting from wiring can be reduced in a semiconductor device having a transistor.

DETAILED DESCRIPTION

Figure 1:
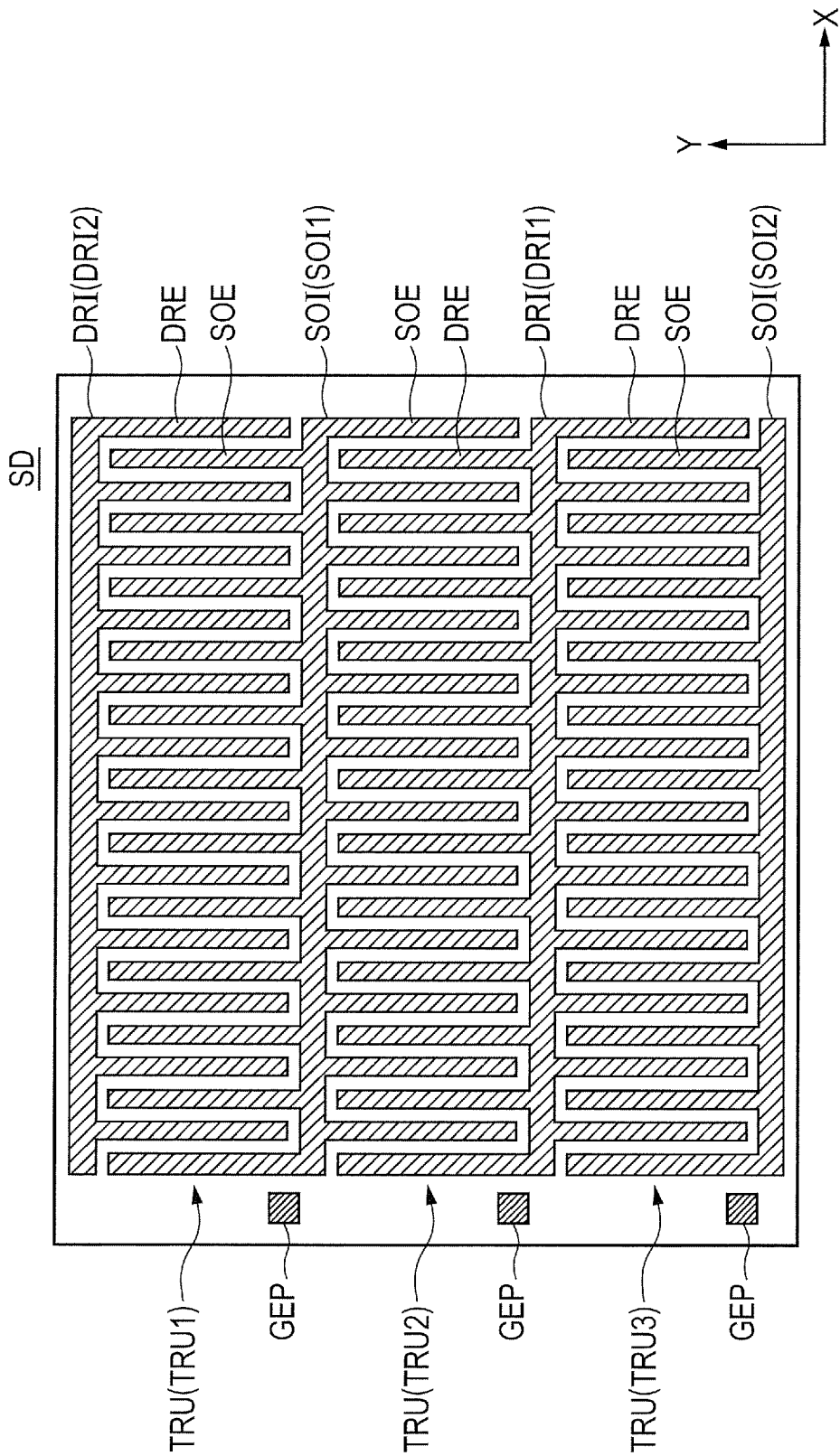
FIG. 1 is a plan view illustrating a configuration of a semiconductor device according to First Embodiment.

Hereinafter, preferred embodiments will be described with reference to accompanying drawings. The same or like components illustrated in each drawing are denoted by like reference numerals, and duplicative descriptions will be appropriately omitted.

First Embodiment

FIG. 1 is a plan view illustrating a configuration of a semiconductor device SD according to First Embodiment. The semiconductor device SD illustrated in this view includes a plurality of transistor units TRU (a first transistor unit (TRU1), a second transistor unit (TRU2), and a third transistor unit (TRU3)), a plurality of drain wiring DRI (second wiring and third wiring), and a plurality of source wiring SOI (first wiring and fourth wiring).

The transistor units TRU are arranged side by side in a first direction (Y direction in the view), each of which has a plurality of transistors TR (which will be described later). The transistors TR are, for example, ones for power control, and the gate electrodes GE thereof (which will be described with reference to FIG. 2) extend in the first direction.

The drain wiring DRI and the source wiring SOI are located alternately between the transistor units TRU, and extend in a direction intersecting with the first direction (second direction: X direction in the view), for example, in the direction perpendicular to the first direction. In other words, the drain wiring DRI are formed in every other spaces between the transistor units TRU, and the source wiring SOI are formed in the remaining spaces between them. Further, in other words, first source wiring SOI1 (first wiring) extends between the first transistor unit TRU1 and the second transistor unit TRU2, and first drain wiring DRI1

(third wiring) extends between the second transistor unit TRU2 and the third transistor unit TRU3. Second drain wiring DRI2 (second wiring) extends on the side of the first transistor unit TRU1 opposite to the side where the first source wiring SOI1 extends, and second source wiring SOI2 (fourth wiring) extends on the side of the third transistor unit TRU3 opposite to the side where the first drain wiring DRI1 extends.

Both the source electrodes SOE of the transistors TR included in the first transistor unit TRU1 and those of the transistors TR included in the second transistor unit TRU2 are coupled to the first source wiring SOI1. The drain electrodes DRE of the transistors TR included in the first transistor unit TRU1 are coupled to the second drain wiring DRI2. Both the drain electrodes DRE of the transistors TR included in the second transistor unit TRU2 and those of the transistors TR included in the third transistor unit TRU3 are coupled to the first drain wiring DRI1. The source electrodes SOE of the transistors TR included in the third transistor unit TRU3 are coupled to the second source wiring SOI2.

In the example illustrated in the view, the semiconductor device SD includes only three transistor units TRU, but may include four or more transistor units TRU. In this case, the drain electrodes of the transistors TR included in a transistor units TRU (not illustrated) located next to the first transistor unit TRU1 are further coupled to the second drain wiring DRI2. In addition, the source electrodes of the transistors TR included in a transistor units TRU (not illustrated) located next to the third transistor unit TRU3 are further coupled to the second source wiring SOI2.

Figure 2:
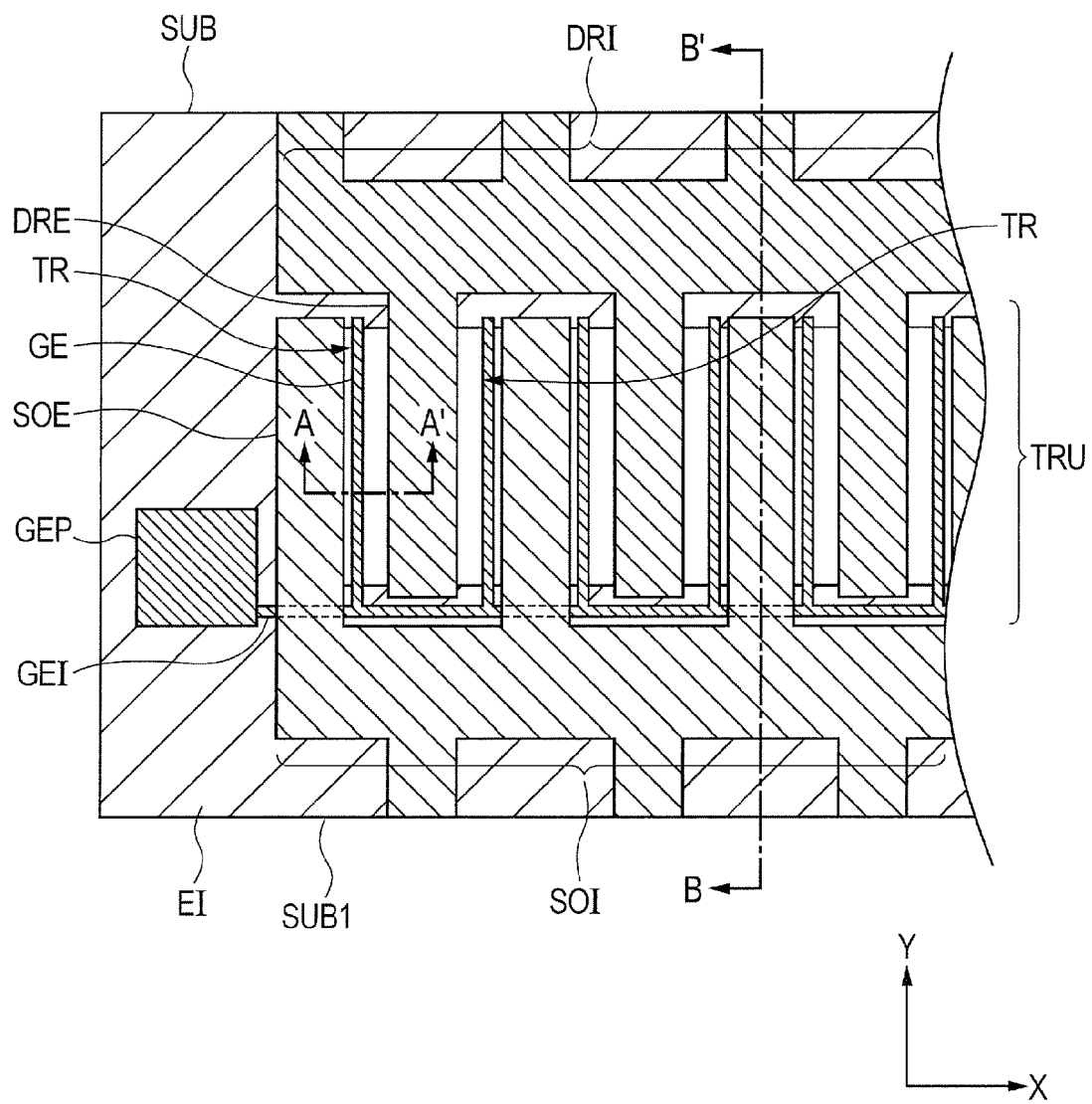
FIG. 2 is a plan view illustrating a configuration of a transistor unit.

FIG. 2 is a plan view illustrating a configuration of the transistor unit TRU. The semiconductor device SD is formed by using a substrate SUB. An element isolation region EI is formed in the substrate SUB. The element isolation region EI isolates a region in which the transistors TR are formed, which is hereinafter referred to as an element formation region, from other regions. The element isolation region EI is a region whose resistance is increased, for example, by introducing a high concentration of B into a barrier layer BAR (which will be described later with reference to FIG. 3) and a channel layer CNL (which will be described later with reference to FIG. 3). The lower end of the element isolation region EI is located over the surface layer of the buffer layer BUF.

The element formation region is provided in each of the transistor units TRU. The transistors TR are formed in the element formation region. The transistors TR are arrayed in the second direction (X direction). Each of the transistors TR has the gate electrode GE. These gate electrodes GE extend in the first direction (Y direction) in parallel to each other. Specifically, the element formation region has a rectangular shape. The gate electrodes GE extend in parallel to the shorter side of the element formation region. The gate electrodes GE are formed of a metal containing, for example, Au or Al.

Both ends of the gate electrode GE are located over the element isolation region EI. One end portion of the gate electrode GE is coupled to a gate plate GEP via gate wiring GEI. The gate wiring GEI is formed over the element isolation region EI and extends in the second direction (X direction). That is, the gate electrodes GE are formed into a comb-like shape.

The source electrodes SOE and the drain electrodes DRE are alternately provided between the gate electrodes GE. In other words, the source electrodes SOE, the gate electrodes GE, the drain electrodes DRE, and the gate electrodes GE are repeatedly arranged in this order along the second direction (X direction) in the element formation region. The source electrodes SOE are coupled in parallel to each other via the source wiring SOI, while the drain electrodes DRE are coupled together via the drain wiring DRI.

Because the source wiring SOI is integrated with the source electrodes SOE, it can be said to be part of the source electrodes SOE. Similarly, because the drain wiring DRI is integrated with the drain electrodes DRE, it can be said to be part of the drain electrodes DRE. That is, the source electrodes SOE and the drain electrodes DRE are respectively formed into a comb-like shape in the present embodiment. The source electrodes SOE and the drain electrodes DRE include, for example, Al.

In the direction in which the source wiring SOI extends (i.e., X direction in the view), the source wiring SOI, included in two of the transistor units TRU adjacent to each other, are arranged alternately, and the drain wiring DRI, included in two of the transistor units TRU adjacent to each other, are also arranged alternately.

Figure 3:
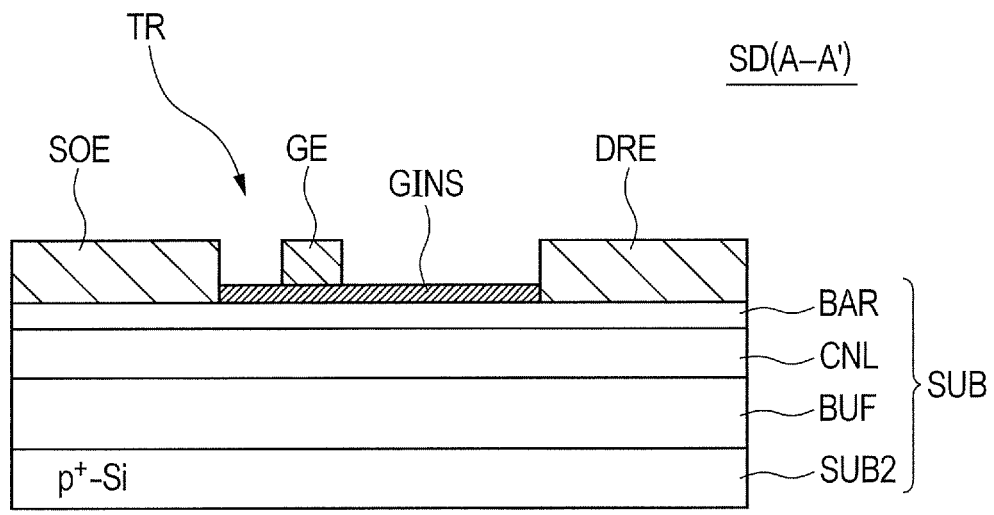
FIG. 3 is a view illustrating a first example of the A-A' section in FIG. 2.

FIG. 3 is a view illustrating a first example of the A-A' section in FIG. 2. The substrate SUB has a configuration in which the buffer layer BUF, the channel layer CNL, and the barrier layer BAR are epitaxially grown in this order over a substrate SUB2. The substrate SUB2 is, for example, a $p^+$-type bulk silicon substrate. The buffer layer BUF is a buffer between the channel layer CNL and the substrate SUB. The buffer layer BUF is a compound semiconductor layer such as, for example, a nitride semiconductor layer in which AlN/GaN is repeatedly laminated. The channel layer CNL is a layer epitaxially grown over the buffer layer BUF. The channel layer CNL includes, for example, GaN, but may include another nitride semiconductor layer containing AlGaN, or the like. The barrier layer BAR is formed of a material whose lattice constant is different from that of the channel layer CNL. The barrier layer BAR includes, for example, AlGaN. A two-dimensional electron gas, which serves as a carrier, is generated in the channel layer CNL with the barrier layer BAR being formed.

The drain electrodes DRE and the source electrodes SOE are formed over the barrier layer BAR. Further, an insulating film INS2 and the gate electrodes GE are formed over a region of the barrier layer BAR between the drain electrodes DRE and the source electrodes SOE. The insulating film INS2 doubles as a gate insulating film GINS in the example illustrated in this view. The insulating film INK includes, for example, $Al_2O_3$ or $SiO_2$ in an amorphous state in the example illustrated in this view. The distance between the gate electrode GE and the drain electrode DRE is larger than that between the gate electrode GE and the source electrode SOE in the example illustrated in this view, in order to secure a withstand voltage between gate and drain.

Figure 4:
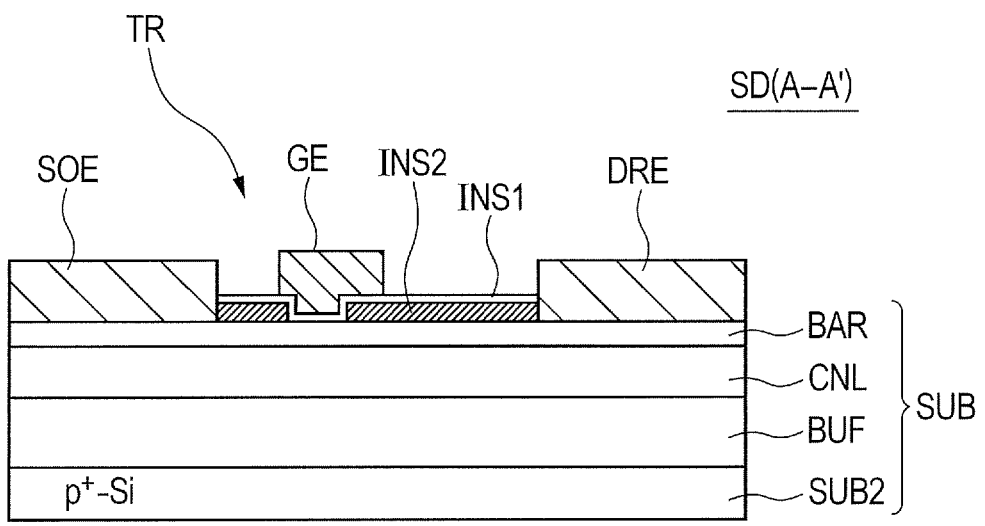
FIG. 4 is a view illustrating a second example of the A-A' section in FIG. 2.

FIG. 4 is a view illustrating a second example of the A-A' section in FIG. 2. The transistor TR is a MIS-HJ-FET (Metal-Insulator-Semiconductor Hetero-Junction Field-Effect Transistor) in the example illustrated in this view. Specifically, part of the gate electrode GE is embedded in the insulating film INS2 to be coupled to the barrier layer BAR via the insulating film INS1. The insulating film INS1 is also formed over the insulating film INK and between the insulating film INS2 and the gate electrode GE. The insulating film INS2 doubles as a gate insulating film in the example illustrated in this view. The insulating film INS2 is, for example, an SiN film in the example illustrated in this view. The insulating film INS1 includes, for example, $Al_2O_3$ or $SiO_2$ in an amorphous state. In such a structure, the two-dimensional electron gas formed in the channel layer CNL breaks off in a portion under the gate electrode GE.

Accordingly, a current flows through the channel layer CNL in a state where a voltage smaller than a threshold value is applied to the gate electrode GE. And when a voltage is applied to the gate electrode GE, a current does not flow through the channel layer CNL.

Figure 5:
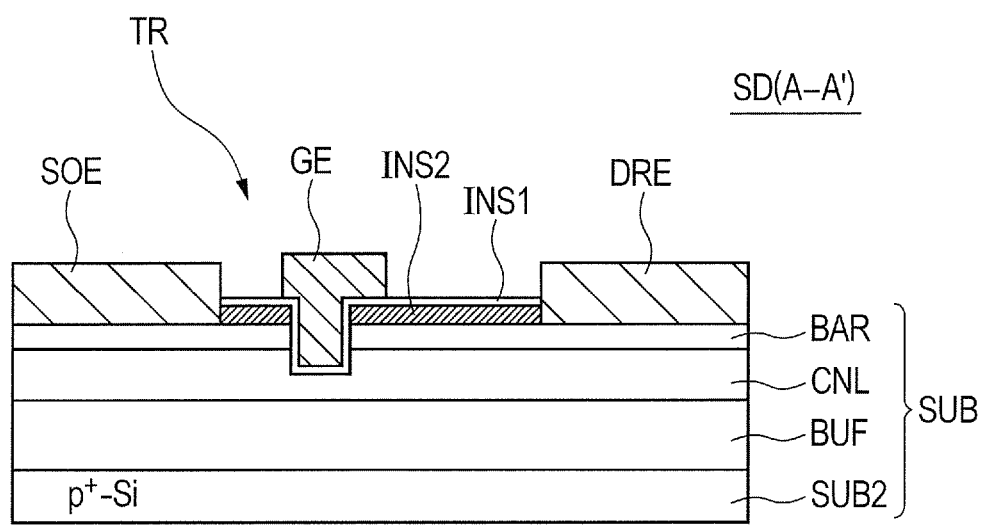
FIG. 5 is a view illustrating a third example of the A-A' section in FIG. 2.

FIG. 5 is a view illustrating a third example of the A-A' section in FIG. 2. In the example illustrated in this view, the transistor TR is a MIS-FET (Metal-Insulator-Semiconductor Field-Effect Transistor), and is a normally-off type transistor. Specifically, part of the gate electrode GE penetrates the insulating film INS2 and the barrier layer BAR to reach the channel layer CNL. The insulating film INS1 is formed between the gate electrode GE and each of the insulating film INS2, the barrier layer BAR and the channel layer CNL. The configuration of the insulating films INS1 and INS2 is the same as that of the second example illustrated in FIG. 6. The insulating film INS1 doubles as a gate insulating film. The two-dimensional electron gas formed in the channel layer CNL is divided by the gate electrode GE. Accordingly, a current does not flow through the channel layer CNL in a state where a voltage is not applied to the gate electrode GE. And when a voltage is applied to the gate electrode GE, a current flows through the channel layer CNL.

Figure 6:
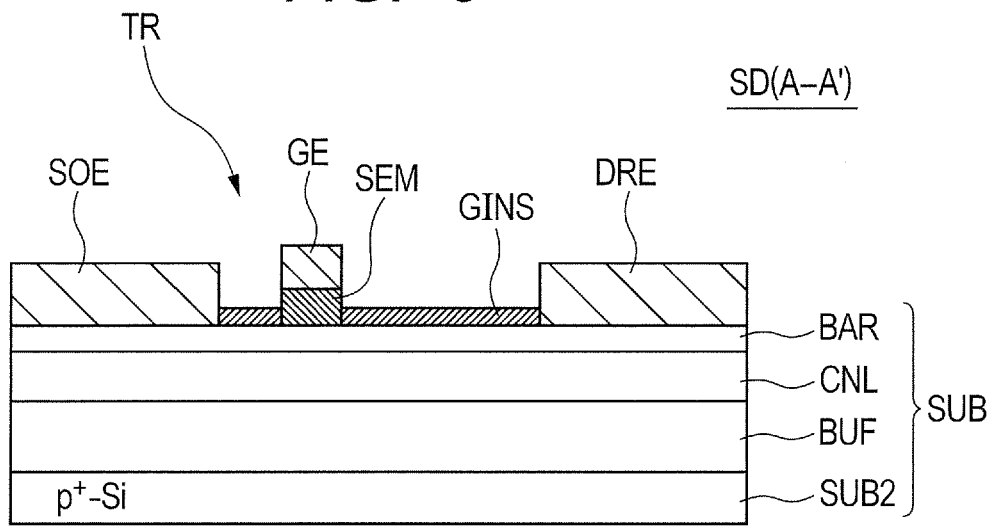
FIG. 6 is a view illustrating a fourth example of the A-A' section in FIG. 2.

FIG. 6 is a view illustrating a fourth example of the A-A' section in FIG. 2. In the example illustrated in this view, the transistor TR is a J-FET (Junction Field-Effect Transistor), and is a normally-off type transistor. Specifically, a first conductivity-type layer SEM is formed between the barrier layer BAR and the gate electrode GE. The first conductivity-type layer SEM includes, for example, AlGaN.

Figure 7:
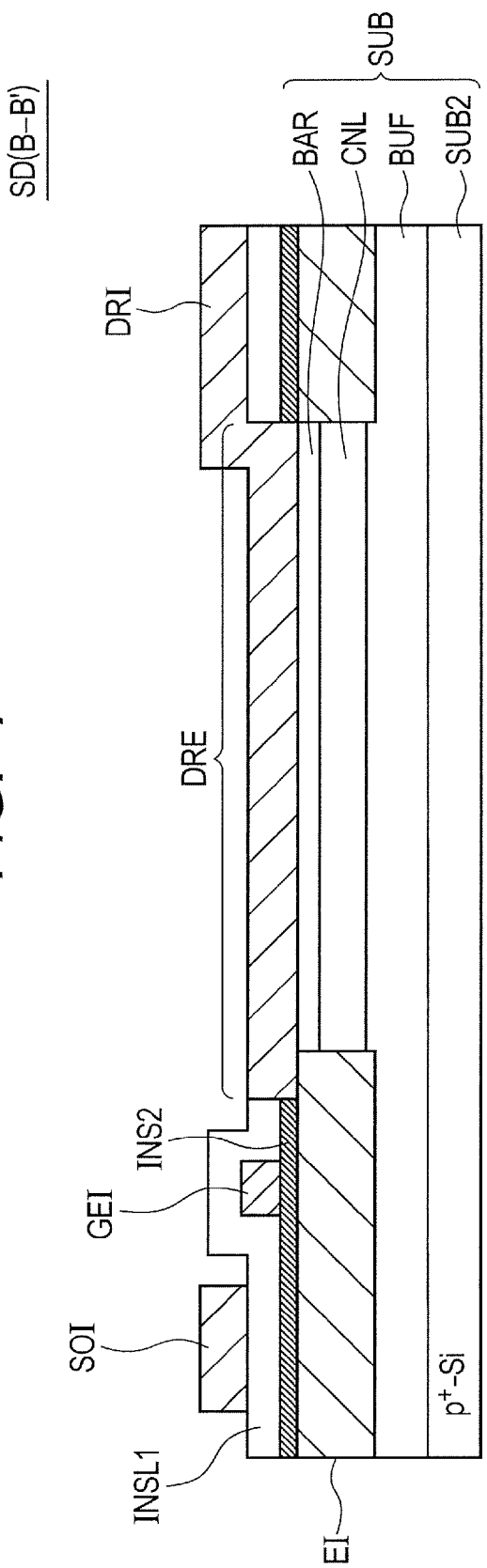
FIG. 7 is a sectional view, taken along B-B' Line in FIG. 2.

FIG. 7 is a sectional view, taken along B-B' Line in FIG. 2. The insulating film INS2 is also formed over the element isolation region EI. The gate wiring GEI is located over the insulating film INS2. The interlayer insulating film INSL1 is formed over the insulating film INS2 and the gate wiring GEI. The interlayer insulating film INSL is formed, for example, by an SiN film. The interlayer insulating film INSL1 is not formed over the element formation region. The source wiring SOI and the drain wiring DRI are formed over the interlayer insulating film INSL1.

Subsequently, an example of a method of manufacturing the semiconductor device SD will be described. At first, the buffer layer BUF, the channel layer CNL, and the barrier layer BAR are epitaxially grown in this order over the substrate SUB2. Subsequently, the element isolation region EI is formed in the barrier layer BAR and the channel layer CNL.

Subsequently, the insulating film INS2 is formed over the barrier layer BAR and the element isolation region EI by using, for example, a CVD method. Subsequently, a film, which will serve as the gate electrodes GE, the gate wiring GEI, and the gate plate GEP, is formed over the insulating film INS2 by a sputtering method. Subsequently, this film is selectively removed. Thereby, the gate electrodes GE, the gate wiring GEI, and the gate plate GEP are formed. Subsequently, the interlayer insulating film INSL1 is formed over the gate electrodes GE and the insulating film INS2 by a CVD method.

Subsequently, a mask pattern is formed over the interlayer insulating film INSL1 that is then etched by using the mask pattern as a mask. Thereby, a portion of the interlayer insulating film INSL1, which is located in the element formation region, is removed. Subsequently, the mask pattern is removed.

Subsequently, a metal film, which will serve as the source electrodes SOE, the source wiring SOI, the drain electrodes DRE, and the drain wiring DRI, is formed over the interlayer insulating film INSL1 and the barrier layer BAR located in the element formation region by using, for example, a sputtering method. Subsequently, this metal film is selectively removed. Thereby, the source electrodes SOE, the source wiring SOI, the drain electrodes DRE, and the drain wiring DRI are formed.

Hereinafter, advantages of the present embodiment will be described. According to the embodiment, the first source wiring SOI is coupled to both the source electrodes SOE included in the first transistor unit TRU1 and the source electrodes SOE included in the second transistor unit TRU2. The first drain wiring DR2 is coupled to both the drain electrodes DRE included in the second transistor unit TRU2 and the drain electrodes DRE included in the third transistor unit TRU3. Accordingly, only one of the drain wiring DRI and the source wiring SOI may be provided between two of the transistor units TRU adjacent to each other. Accordingly, the width of the drain wiring DRI or the source wiring SOI can be more increased, in comparison with the case where both of the wiring are arranged between two of the transistor units TRU adjacent to each other, because a space is not required between the drain wiring DRI and the source wiring SOI that are adjacent to each other. Accordingly, of the parasitic resistance generated in the semiconductor device SD, a resistance component resulting from wiring can be reduced.

In particular, the channel of the transistor TR is formed in the channel layer CNL in the present embodiment. The channel layer CNL is a compound semiconductor layer whose resistance is lower than that of silicon. In this case, if a wiring resistance is high, the significance of using the compound semiconductor layer becomes small, even when the parasitic resistance of the transistor TR is reduced. Because a resistance component resulting from wiring can be reduced in the embodiment, the effect of using a compound semiconductor layer for the channel layer of the transistor TR becomes large.

Second Embodiment

Figure 8:
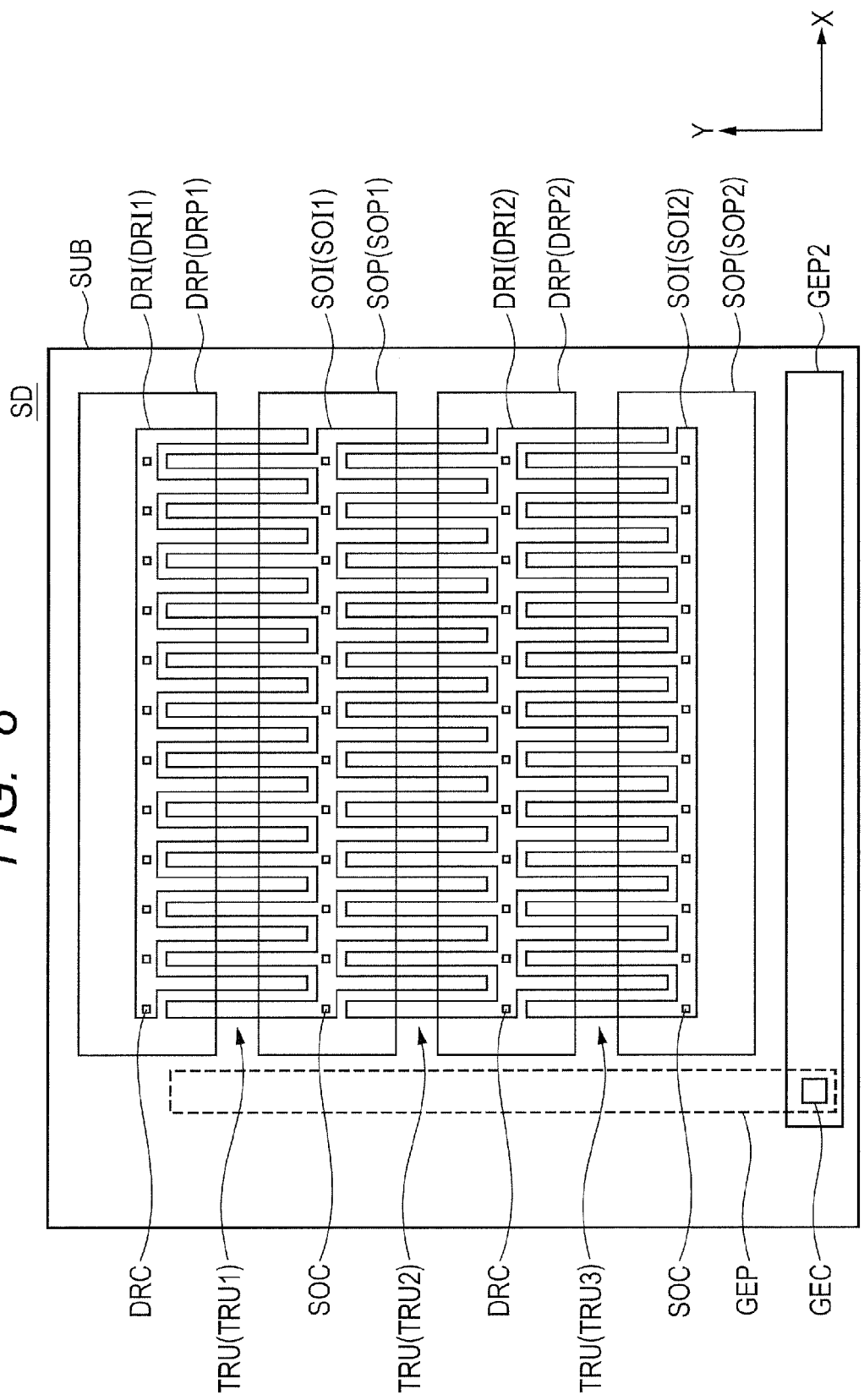
FIG. 8 is a plan view illustrating a configuration of a semiconductor device according to Second Embodiment.
Figure 9:
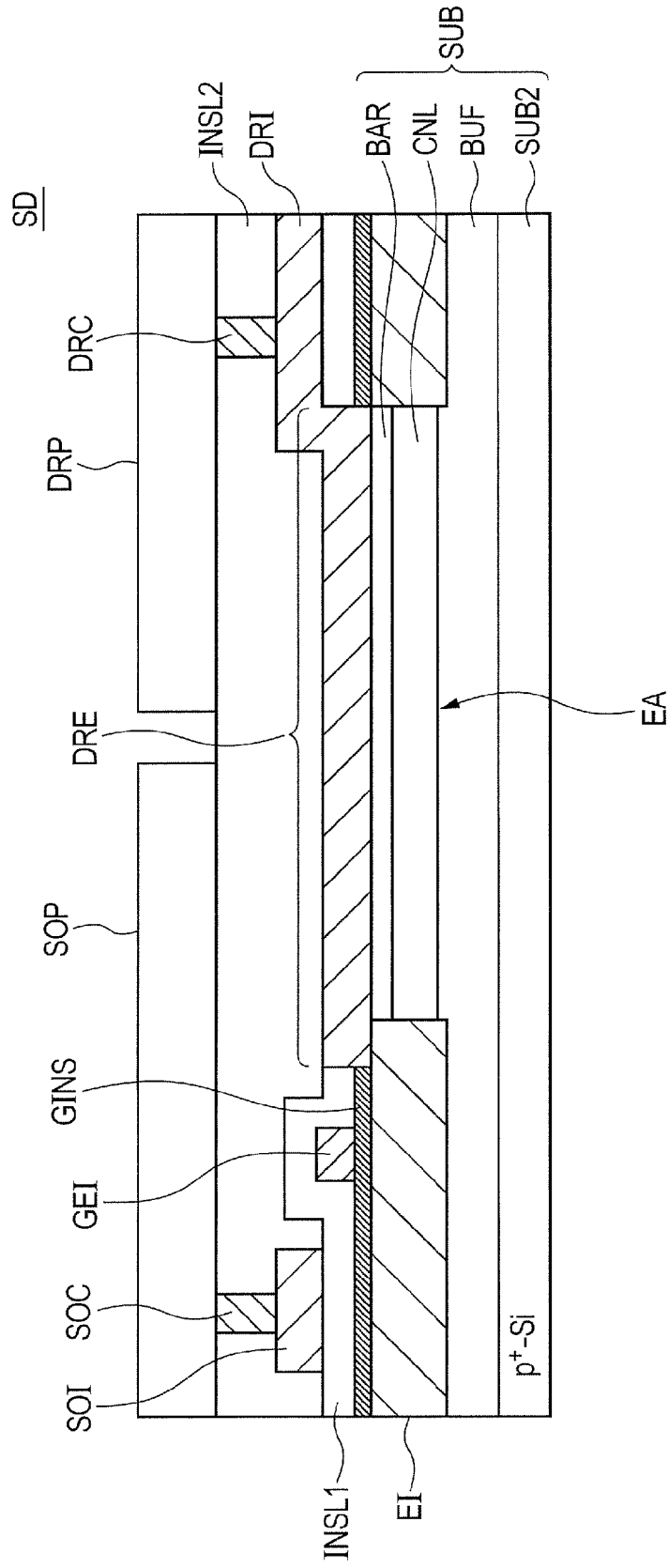
FIG. 9 is a sectional view of the semiconductor device illustrated in FIG. 8.

FIG. 8 is a plan view illustrating a configuration of a semiconductor device SD according to Second Embodiment, and FIG. 9 is a sectional view of the semiconductor device SD illustrated in FIG. 8. FIGS. 8 and 9 correspond to FIGS. 1 and 7 in First Embodiment, respectively. The semiconductor device SD according to the present embodiment includes: a plurality of drain pad electrodes DRP (second upper layer conductive pattern and third upper layer conductive pattern); a plurality of drain contacts DRC (second coupling members and third coupling members); a plurality of source pad electrodes SOP (first upper layer conductive pattern and fourth upper layer conductive pattern); and a plurality of source contacts SOC (first coupling members and fourth coupling members).

Each of the source pad electrodes SOP and the drain pad electrodes DRP is formed in a layer above drain wiring DRI and source wiring SOI, and has a width larger than those of the drain wiring DRI and the source wiring SOI. The source pad electrodes SOP and the drain pad electrodes DRP extend in a second direction (X direction in the view).

As illustrated in FIG. 8, at least part of the source pad electrode SOP is overlapped with the source wiring SOI, and at least part of the drain pad electrode DRP is overlapped with the drain wiring DRI. The source contacts SOC are located in a region where the source pad electrode SOP and the source wiring SOI are overlapped with each other. The drain contacts DRC are located in a region where the drain pad electrode DRP and the drain wiring DRI are overlapped with each other. The source contacts SOC couple the source wiring SOI to the source pad electrode SOP, and the drain contacts DRC couple the drain wiring DRI to the drain pad electrode DRP. The source pad electrode SOP is provided to reduce the seeming resistance of the source wiring SOI, while the drain pad electrode DRP is provided to reduce that of the drain wiring DRI.

As illustrated in FIG. 9, an interlayer insulating film INSL2 is formed over the source wiring SOI, the drain wiring DRI, and an interlayer insulating film INSL1. The interlayer insulating film INSL2 is, for example, a silicon oxide film. The source pad electrodes SOP and the drain pad electrodes DRP are formed over the interlayer insulating film INSL2, and the source contacts SOC and the drain contacts DRC are embedded in the interlayer insulating film INSL2. The source contacts SOC may be formed integrally with the source pad electrode SOP. Similarly, the drain contact DRC may be formed integrally with the drain pad electrode DRP. The source pad electrodes SOP and the drain pad electrodes DRP are formed of a metal such as, for example, Al.

As illustrated in FIG. 8, part of the drain pad electrode DRP (first drain pad electrode DRP1) coupled to first drain wiring DRI1 is overlapped with a first transistor unit TRU1, when planarly viewed. Part of the source pad electrode SOP (first source pad electrode SOP1) coupled to first source wiring SOI is overlapped with at least one of the first transistor unit TRU1 and a second transistor unit TRU2. Part of a second drain pad electrode DRP2 coupled to second drain wiring DRI2 is overlapped with at least one of the second transistor unit TRU2 and a third transistor unit TRU3. Further, part of a second source pad electrode SOP2 coupled to second source wiring SOI2 is overlapped with the third transistor unit TRU1. With such a configuration, the seeming resistance of the source electrode SOE and that of the drain electrode DRE can be further reduced by enlarging the planar shapes of the drain pad electrode DRP and the source pad electrode SOP, without enlarging that of the semiconductor device SD.

In the example illustrated in this view, part of the first source pad electrode SOP is overlapped with the first transistor unit TRU1, while another part thereof is overlapped with the second transistor unit TRU2. The width of the part of the first source pad electrode SOP1, the part being overlapped with the first transistor unit TRU1, and that of the another part thereof, the another part being overlapped with the second transistor unit TRU2, are almost equal to each other. Part of the second drain pad electrode DRP2 is overlapped with the second transistor unit TRU2, while another part thereof is overlapped with at least one side of the third transistor unit TRU3. The width of the part of the second drain pad electrode DRP2, the part being overlapped with the second transistor unit TRU2, and that of the another part thereof, the another part being overlapped with the third transistor unit TRU3, are almost equal to each other.

Figure 10:
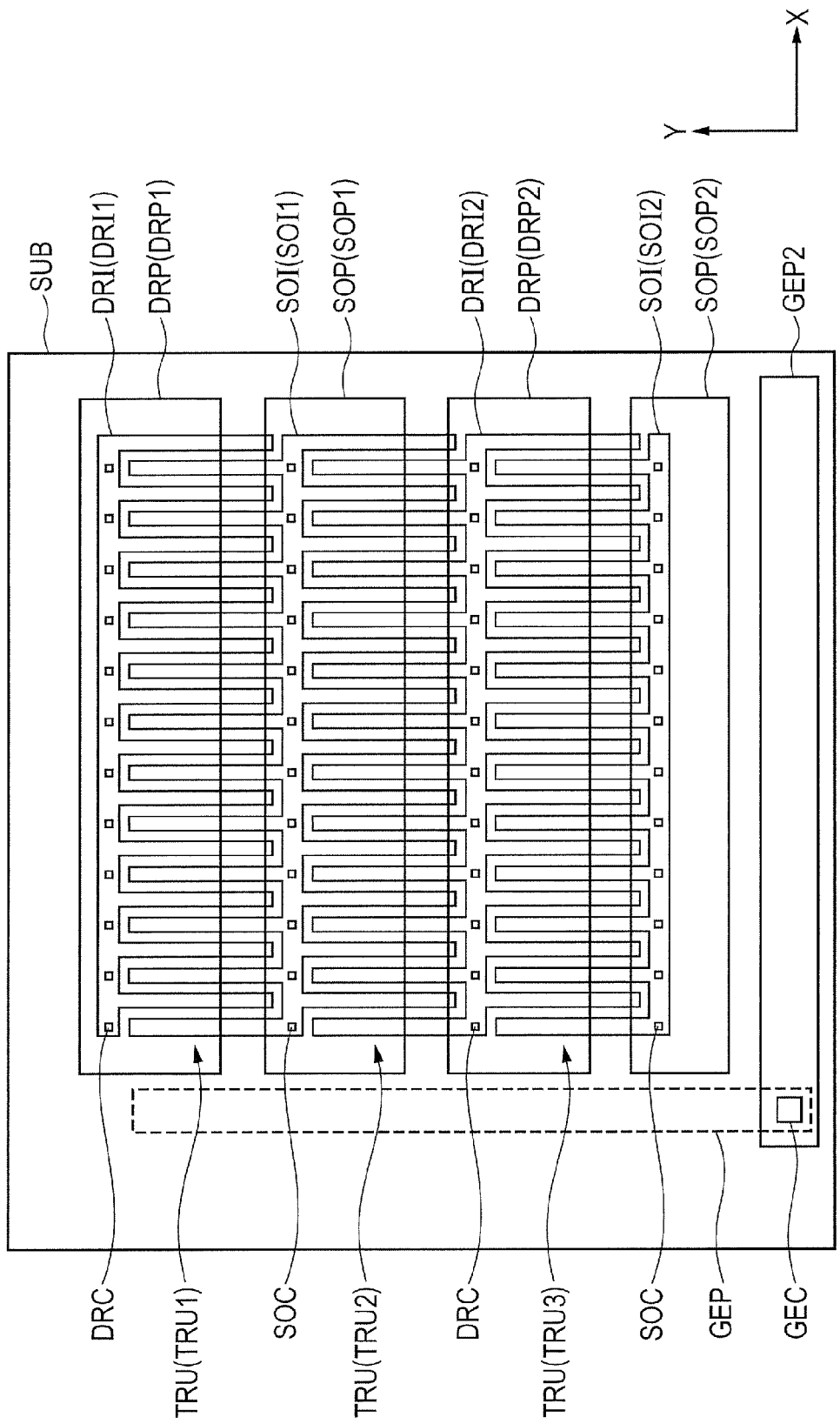
FIG. 10 is a view illustrating a variation of FIG. 8.

As illustrated in FIG. 10, however, the width of the part of the first source pad electrode SOP1, the part being overlapped with the first transistor unit TRU1, and that of the another part thereof, the another part being overlapped with the second transistor unit TRU2, may be different from each other. Additionally, the width of the part of the second drain pad electrode DRP2, the part being overlapped with the second transistor unit TRU2, and that of the another part thereof, the another part being overlapped with the third transistor unit TRU3, may be different from each other.

Figure 11:
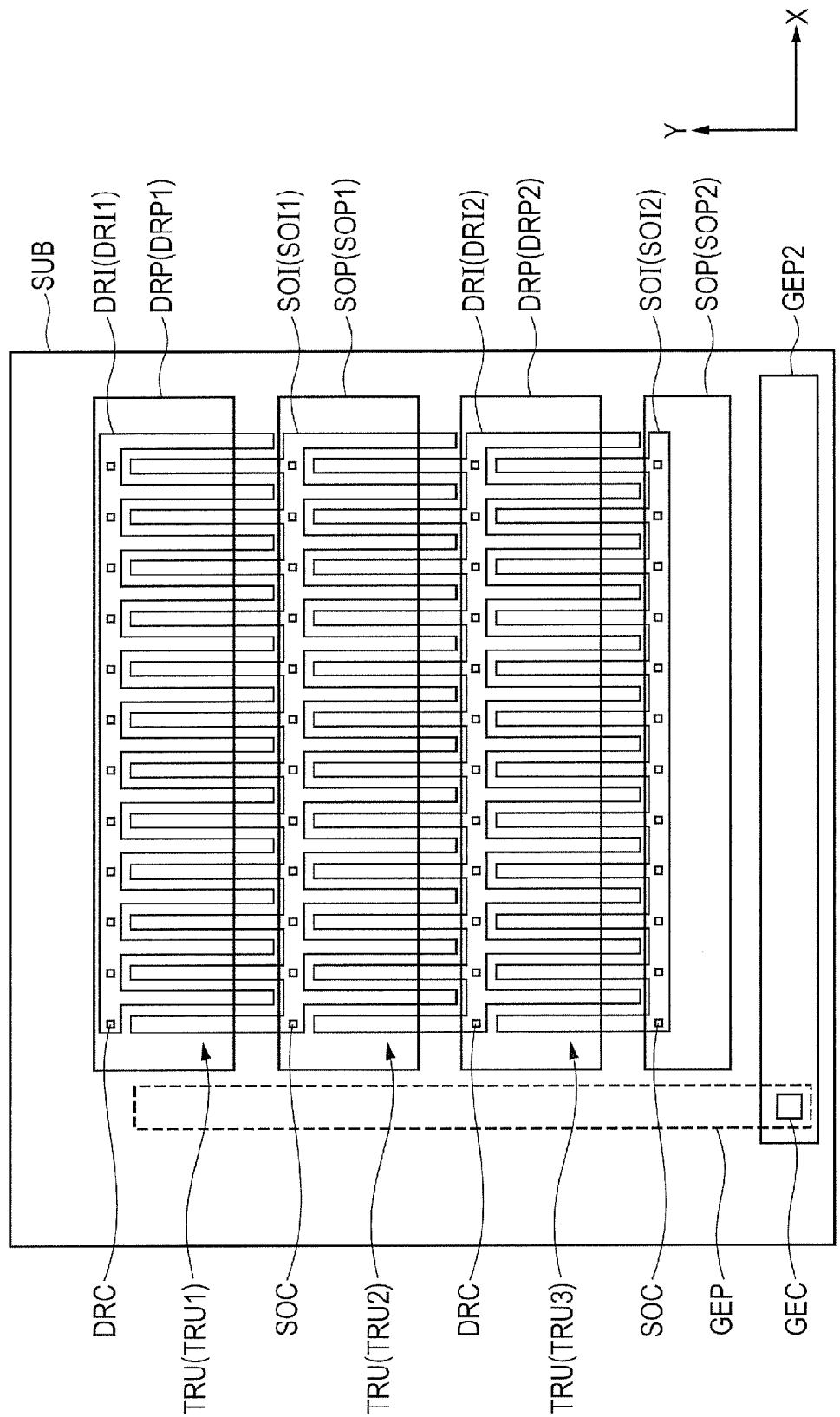
FIG. 11 is a view illustrating a variation of FIG. 8.

Further, the first drain pad electrode DRP1 may be overlapped only with the second transistor unit TRU2, and the second source pad electrode SOP2 may be overlapped only with the third transistor unit TRU3, as illustrated in FIG. 11.

As illustrated in FIGS. 8, 10 and 11, a gate pad pole GEP is formed in a layer the same as those of the source pad electrode SOP and the drain pad electrode DRP. A gate pad electrode GEP2 is coupled to the gate plate GEP via a gate contact GEC embedded in the interlayer insulating film INSL2.

Figure 12:
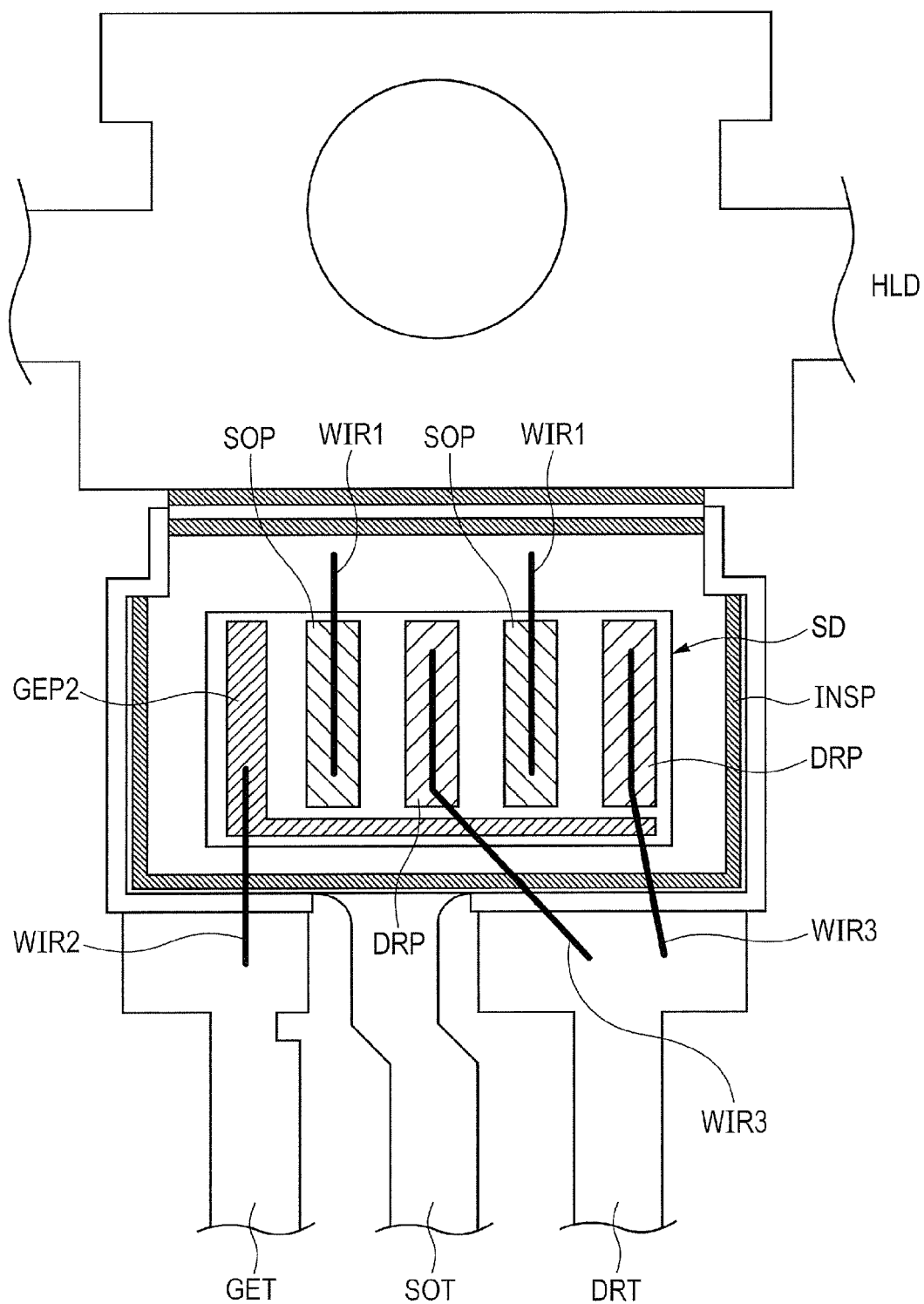
FIG. 12 is a view illustrating a configuration of an electronic apparatus including a semiconductor device SD.

FIG. 12 is a view illustrating a configuration of an electronic apparatus ED including the semiconductor device SD according to the present embodiment. In the example illustrated in this view, the semiconductor device SD is mounted over a holding member HLD. The holding member HLD is, for example, a lead frame of a semiconductor package, and includes a gate terminal GET, a source terminal SOT, and a drain terminal DRT. The gate terminal GET is coupled to the gate pad electrode GEP2 via a bonding wire WIR2. The source terminal SOT is coupled to the source pad electrodes SOP via bonding wires WIR1 (a first bonding member and a fourth bonding member), while drain terminal DRT is coupled to the drain pad electrodes DRP via bonding wires WIR3 (a second bonding member and a third bonding member). With such a configuration, it is not required to provide pads, to which the bonding wires WIR1 and WIR3 are coupled, separately from the source pad electrodes SOP and the drain pad electrodes DRP, and hence the semiconductor device SD can be suppressed from growing in size. Additionally, the bonding wires WIR1 are joined to the source pad electrodes SOP at a plurality of points, and the bonding wires WIR3 are joined to the drain pad electrodes DRP at a plurality of points. Accordingly, a voltage can be supplied to the source pad electrodes SOP or the drain pad electrodes DRP from a plurality of places. The resistances of the source pad electrode SOP and the drain pad electrode DRP are generally higher than those of the bonding wires WIR1 and WIR3. Accordingly, with the aforementioned configuration, the ratio, in which the source pad electrodes SOP and the drain pad electrodes DRP account for of a current pathway, becomes small, and as a result, the resistance of the current pathway can be reduced.

Alternatively, because the source pad electrode SOP and the drain pad electrode DRP are large in width, ribbon-shaped bonding wires (bonding ribbons) can be adopted as the bonding wires WIR1 and WIR3. In this case, resistance components resulting from the bonding wires WIR1 and WIR3 can also be reduced. Further, the contact area between the bonding wire WIR1 and the source pad electrode SOP and that between the bonding wire WIR3 and the drain pad electrode DRP can be respectively increased, and hence the respective coupling resistances between them can also be reduced.

As described above, the same advantages as those in First Embodiment can also be obtained in the present embodiment. Further, because the source pad electrodes SOP and the drain pad electrodes DRP are provided, the seeming resistances of both the source electrode SOE and the drain electrode DRE can be reduced.

Third Embodiment

Figure 13:
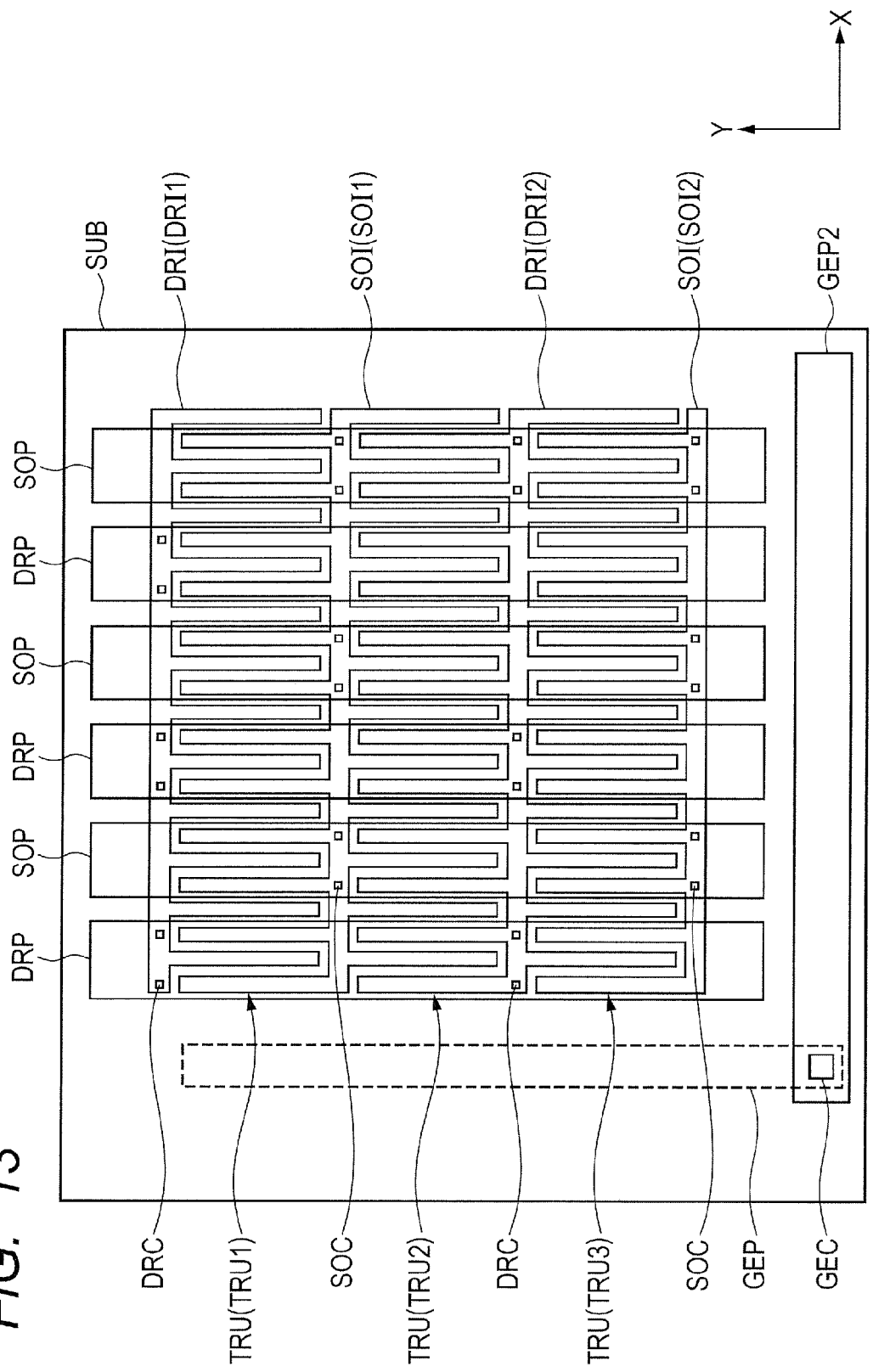
FIG. 13 is a view illustrating a configuration of a semiconductor device according to Third Embodiment.

FIG. 13 is a view illustrating a configuration of a semiconductor device SD according to Third Embodiment. The semiconductor device SD according to the present embodiment has the same configuration as that of the semiconductor device SD of Second Embodiment, except for the following points.

At first, the drain pad electrodes DRP and the source pad electrodes SOP extend along a direction that intersects with the source wiring SOI (i.e., second direction). The drain contacts DRC are respectively provided at the intersections between the drain pad electrodes DRP and each drain wiring DRI, while the source contacts SOC are respectively provided at the intersections between the source pad electrodes SOP and each source wiring SOI. In other words, the drain electrodes DRE are coupled to an identical drain pad electrode DRP via the drain contacts DRC different from each other, while the source electrodes SOE are coupled to an identical source pad electrode SOP via the source contacts SOC different form each other.

The same advantages as those in Second Embodiment can also be obtained in the present embodiment.

The invention made by the present inventors has been specifically described above based on preferred embodiments, but the invention should not be limited to the preferred embodiments, and it is needless to say that various modifications may be made to the invention within a range not departing from the gist of the invention.

What is claimed is:

1. A semiconductor device comprising:
   a plurality of transistor units including adjacent first, second and third transistor units arranged side by side in a first direction, each transistor unit having a plurality of transistors that are coupled to each other along a second direction intersecting the first direction;
   a source wiring shared by adjacent first and second transistor units, the source wiring being coupled to each transistor in the adjacent first and second transistor units;
   a drain wiring shared by adjacent second and third transistor units, the drain wiring being coupled to each transistor in the adjacent second and third transistor units;
   a source pad electrode extending in the second direction and overlapping a portion of the source wiring via an insulating film, the source pad electrode being coupled to the source wiring; and
   a drain pad electrode extending in the second direction and overlapping a portion of the drain wiring via an insulating film, the drain pad electrode being coupled to the drain wiring; wherein:
   the source pad electrode and the drain pad electrode are arranged side by side in the first direction and do not overlap each other.

2. The semiconductor device according to claim 1, further comprising:
   a gate pad electrode extending in the second direction; and
   a gate plate coupled to the gate pad electrode via a gate contact, the gate plate extending in the first direction.

3. The semiconductor device according to claim 2, wherein:
   the gate plate is coupled to a plurality of gate electrodes via a gate wiring; and
   the plurality of gate electrodes have a comb-like shape.

4. The semiconductor device according to claim 3, wherein:
   the source pad electrode overlaps at least portions of said plurality of gate electrodes.

5. The semiconductor device according to claim 1, wherein:
   at least part of the source pad electrode overlaps a gate electrode of a plurality of the transistors.

6. The semiconductor device according to claim 1, wherein each of the source and drain pad electrodes has a width in the second direction, which is larger than a width of the respective source and drain wirings, in said second direction.

7. The semiconductor device according to claim 1, wherein bonding wires are joined to the source pad electrode and to the drain pad electrode at a plurality of points, the bonding wires being coupled to a terminal located on a lead frame of a semiconductor package.

* * * * *